United States Patent [19]

Braren et al.

[11] Patent Number: 5,246,885
[45] Date of Patent: Sep. 21, 1993

[54] DEPOSITION METHOD FOR HIGH ASPECT RATIO FEATURES USING PHOTOABLATION

[75] Inventors: Bodil E. Braren, Hartsdale; Karen H. Brown, Yorktown Heights, both of N.Y.; Kathleen A. Perry, West Hills, Calif.; Rangaswamy Srinivasan, Yorktown Heights; Alvin Sugerman, Hopewell Junction, both of N.Y.

[73] Assignee: International Business Machines Corporation, Armonk, N.Y.

[21] Appl. No.: 933,951

[22] Filed: Aug. 20, 1992

Related U.S. Application Data

[63] Continuation of Ser. No. 648,325, Jan. 29, 1991, abandoned, which is a continuation of Ser. No. 449,165, Dec. 13, 1989, abandoned.

[51] Int. Cl.$^5$ .................... H01L 21/00; H01L 21/02; H01L 21/302; H01L 21/463
[52] U.S. Cl. .................................. 437/225; 437/228; 437/233; 437/235; 437/245
[58] Field of Search ............... 437/225, 228, 233, 235, 437/245; 148/DIG. 158

[56] References Cited

U.S. PATENT DOCUMENTS

4,673,475 6/1987 Windischmann ............... 204/192.11
4,752,455 6/1988 Mayer ............................... 427/53.1

FOREIGN PATENT DOCUMENTS

0278494 2/1988 European Pat. Off. .
53-18185 6/1978 Japan .
0189669 8/1986 Japan ............................. 204/192.11
1214851 12/1970 United Kingdom .
2178060 3/1986 United Kingdom .

OTHER PUBLICATIONS

Grill, A., Ion beam reactively sputtered silicon nitride coatings, Vaccuum, vol. 33, No. 6, pp. 329-332, 1983.
Ishii, K., Characteristics of TA and MO thin films deposited by High Current Ion Beam Sputterings, Electronics and Communications in Japan, vol. 63-C, No. 1, 1980, pp. 106-113.
Wolf, S., Silicon Processing for the VLSI Era, vol. 1, pp. 335-373, Lattice Press, 1983.
Townsend, P., Photon-Induced Sputtering, Surface Science 90(1979) pp. 256-264.
Kosha, "Method and Apparatus For Flattening Thin Film Device", Patent Abstract of Japan, publication no. JP60124825 dated Mar. 7, 1985, Abstract vol. 009280.
Biunno, et al., "Low-Temperature Processing of Titanium Nitride Films By Laser Physical Vapor Deposition", Applied Physics Letters, vol. 54, No. 16, pp. 1519-1521, Apr. 17, 1989.
J. Narayan, et al., "Formation of Thin Superconducting Films By the Laser Processing Method" App. Phys. Lett. 51 (22), Nov. 30, 1987, 1987 American Institute of Physics, pp. 1845-1847.
D. Dijkkamp, et al., "Preparation of Y—Ba—Cu Oxide Superconductor Thin Films Using Pulsed Laser Evaporation From High Tc Bulk Material" App. Phys. Lett. 51 (8), Aug. 24, 1987, 1987 American Institute of Physics, pp. 619-621.
H. Helvajian, et al., "Threshold Level Laser Photoablation of Crystalline Silver: Ejected Ion Translational Energy Distributions" J. Chem. Phys. 91(4)89 p. 2616.

(List continued on next page.)

Primary Examiner—Brian E. Hearn
Assistant Examiner—B. Everhart
Attorney, Agent, or Firm—Ira David Blecker

[57] ABSTRACT

A method for providing superior fill of features in semiconductor processing utilizes a laser ablation system. Deposition is obtained by ablating target materials which are driven off perpendicular to the target in the direction of the deposition surface. The method provides complete fill of high aspect ratio features with nominal heating of the substrate. Alloys and graded layers, as well as pure metals, can be deposited in low temperature patterned layers. In addition, the system has been used to achieve superior trench filling for isolation structures.

28 Claims, 2 Drawing Sheets

OTHER PUBLICATIONS

High-Aspect-Ratio Via-Hole Filling With Aluminum Melting By Excimer Laser Irradiation For Multilevel Interconnection, by R. Mukai et al., IEEE Electron Device Letters, vol. EDL-8, No. 2, Feb. 1987, pp. 76-78.

Planarization of Gold and Aluminum Thin Films Using A Pulsed Laser, by D. B. Tuckerman et al., IEEE Electron device Letters, vol. EDL-7, No. 1, Jan. 1986, pp. 1-4.

Laser-Induced Plasmas For Primary Ion Deposition of Epitaxial Ge and Si Films, by D. Lubben et al., J. Vac. Sci. Technol. B 3(4), Jul./Aug. 1985 1985 American Vacuum Society, pp. 968-974.

Yu. A. Bykovskii, et al., "Deposition of Metal, Semiconductor, and Oxide Films With A Periodically Pulsed $CO_2$ Laser" Sov. Phys. Tech. Phys. 23(5), May 1978, 1979 American Institute of Physics, pp. 578-581.

G. Hass, et al., "Vacuum Deposition of Dielectric and Semiconductor Films By A $CO_2$ Laser" Applied Optics, vol. 8, No. 6, Jun. 1969, pp. 1115-1118.

T. Takagi, "Role of Ions in Ion-Based Film Formation" Thin Solid Films, 91 (1982) 1-17, pp. 1-17.

Semiconductor International, Sep. 1987, pp. 126-132, S. Gupta, et al., "Planarization of Sputtered Aluminum.".

Solid-State Science and Technology, Jun. 1985, pp. 1466-1472, Y. Homma, et al., "Planar Deposition of Aluminum by RF/DC Sputtering with RF Bias".

J. Appl. Phys., vol. 54, No. 6, Jun. 1983, pp. 3489-3496, I. A. Blech, et al., "Step Coverage Simulation and Measurement In A DC Planar Magnetron Sputtering System".

Article entitled, "Metallization of High Aspect Microstructures With A Multiple Cycle Evaporation/Sputter Etching Process," p. 7, Jun. 1986, M. A. Lardon, et al.

Mei, High-Aspect-Ratio Via Filling with AL using partially Ionized Beam Deposition, Semicond. Research Corp. Com., Oct. 1987, pp. 1-9.

Shinn, Excimer laser photoablation of silicon, J. Vac. Sci. Technol. B4(6), Nov. 1986, pp. 1273-1277.

Lubben, Laser-induced plasmas for primary ion deposition of epitaxial Ge and Si Films, J. Vac. Sci. Tech., B3(4), Jul. 1985, pp. 968-974.

Takagi, Role of Ions in Ion-Based Film Formation, Thin Solid Films, 92(1982), pp. 1-17.

Ablation of Metal Surfaces By Pulsed Ultraviolet Lasers Under Ultrahigh Vacuum, by R. Viswanathan, J. Opt. Soc. Am. B/vol. 3, No. 5/May 1986, pp. 796-800.

High-Aspect-Ratio Via Filling With Al Using Partially Ionized Beam Deposition, by S-N Mei et al., Center of Integrated Electronics Rensselear Polytechnic Institute, Troy, NY, IBM Corp. Essex Jct. Vt.

DEPOSITION METHOD FOR HIGH ASPECT RATIO FEATURES USING PHOTOABLATION

This application is a continuation of application Ser. No. 07/648,325, filed Jan. 29, 1991 now abandoned, which is a continuation of application Ser. No. 07/449,165, filed Dec. 13, 1989, now abandoned.

The invention relates to the deposition of materials by laser ablation of a target source material. More particularly, it relates to the application of laser ablation to do the following: deposit metallization in dielectric layers for semiconductor multilevel metallurgy; deposit alloys of varying composition for semiconductor applications; and, to provide semiconductor or insulator materials for shallow trench transistor isolation structures.

BACKGROUND OF THE INVENTION

In the semiconductor industry, there is a need to deposit materials across areas of vastly differing topography. On a single workpiece, there may be a need for deposition of insulative material into a shallow trench providing isolation for a transistor which additionally requires alloyed contacts to be deposited into high aspect ratio vias and further requires continuous pure metal contacts through multiple levels of insulator material. Deposition techniques of chemical vapor deposition (CVD), evaporation and sputtering are well established in the industry. However, as discussed in detail below, no single deposition technique is workable for all of the industry needs. Nor are the well-known techniques usable or extendable to the dimensional requirements of the leading edge of the technology.

Specifically, in multilevel metallurgy processing, there is a need to deposit conductors into high aspect ratio trenches in the dielectric layers. In the past, a so-called "cloisonne" approach was used wherein blanket metal was deposited and patterned by reactive ion etching, followed by deposition of the dielectric material over, and between, the metal features, and finally, polishing of the overlying dielectric material to reveal the metal. A similar embodiment of the cloisonne approach is to deposit the metal through a lift-off pattern, as is well-known in the semiconductor art, and proceeding to deposit the dielectric as above. The lift-off and standard cloisonne processes are functional for processing layers having large features. However, as the patterned metal features become finer, it is virtually impossible to perform liftoff without removing the desired metal features along with the overlying metal or resist. Furthermore, overcoating with the dielectric frequently causes breaking, or at least bending of the fine metal lines or studs. The foregoing difficulties indicate the need for a major processing shift. Future technological requirements also include a switch from the currently preferred metallurgy of aluminum to copper, which is a softer metal more prone to distortion under pressure. The standard, reactive ion etching (RIE) method for patterning of the blanket metal in cloisonne processing cannot be practiced with Cu, since there are no volatile decomposition products of Cu. The alternative deposition liftoff techniques are also limited in applicability in a copper structure given the susceptibility of copper to corrosion by the lift-off solvents. Therefore, a cloisonne replacement process must address not only the dimensional tolerances needed for the advanced technology but also the material requirements.

A so-called "damascene" process flow has been developed to replace the cloisonne techniques of the past. The damascene process, as is taught and claimed in U.S. Pat. No. 4,702,792 of Chow, et al, assigned to the present assignee, the teachings of which are herein incorporated by reference, includes the following basic process flow: a dielectric material is blanket deposited onto the substrate; the dielectric material is patterned to form openings; conductive material is deposited onto the substrate in sufficient thickness to fill the openings; and excess conductive material is removed from the surface of the dielectric by means of a chemical or mechanical, or combined chemical-mechanical polishing technique. Deposition techniques currently in use and taught in the literature include conformal coating techniques such as CVD and sputtering. Drawbacks associated with CVD include the creation of voids in the center of the filled opening due to the conformal nature of the deposition method, particularly in the instance of high aspect ratio features. With sputtering, it is impossible to achieve a complete fill, particularly along the sidewalls of high aspect ratio openings. Evaporation is successful in covering shallow features; but, is generally not practical for the filling of high aspect ratio features.

The teachings of Chow, et al not only provide an alternative technique to the cloisonne approach of substrate processing, but also discuss the use of polymeric materials as the dielectric for electronic devices. The Chow, et al patent teaches the use of a polymeric material as the patterned dielectric which may remain in place after metal deposition and polishing to serve as the dielectric material; or, may be removed and subsequently replaced by glass or another suitable dielectric. Polymeric materials are desirable for a number of reasons, such as cost, materials characteristics, etc. But, the use of polymers does compound the processing difficulties given the stringent temperature constraints associated with polymers. CVD cannot, typically, be utilized with the relatively low temperature polymeric insulators. Likewise, sputtering cannot be utilized with a polymeric layer wherein the dielectric itself could be damaged by the sputtering process.

The multilevel metallization (so-called back-end-of-the-line) processing, which has been described at length heretofore, calls for a lower level of finesse than is required in the formation of the underlying transistor structure itself where chemical-mechanical polishing is not as option. Greater control, both mechanical and thermal, is required when depositing materials such as silicon for isolation trenches or metal alloys for transistor contacts. Isolation trenches have become more difficult to fill given the increasingly shallow profiles of devices. Laser ablation of silicon has been proposed in the art (see, e.g. "Laser-induced Plasmas for Primary Ion Deposition of Epitaxial Ge and Si Films", D. Lubben, et al, Journal Vac. Sci. Tech., Volume B, No. 3, p. 968 (1985)); however, for fine (either narrow and deep, or shallow) features, the technique has proven to be too unrefined. Large silicon particles, or "spits", are deposited leading to incomplete fill in the case of high aspect ratio features and low density, non-planar fill in the case of shallow features. An accurate method for providing atomic silicon to prescribed surfaces is, therefore, needed.

With respect to contact formation, it may be desirable to achieve graded or alloyed interfaces on the doped polysilicon. In addition to the dimensional requirements, it is imperative to operate at sufficiently low temperatures to prevent diffusion of the dopant from the underlying polysilicon into the contact material. CVD cannot be utilized to deposit alloys where graded interfaces are desired. Moreover, typical CVD operating temperatures are excessive where diffusion is concerned. Sputtering can provide alloys, however, as noted above, it is impossible to achieve a complete fill of fine features with sputtering.

Ideally, the apparently disparate processing requirements set forth above can be addressed wherein a single deposition technique can be employed in the various stages of semiconductor device processing. It may be further desired to minimize tooling by thereby employing a single deposition chamber for the various processing steps.

It is, therefore, an objective of the present invention to provide a method for achieving a complete fill of a high aspect ratio feature.

It is another objective of the present invention to provide metal features having more than one metallic constituent by means of a single fill process.

It is yet another objective to provide a low temperature method for depositing metal into a patterned polymeric dielectric layer.

It is also an objective of the invention to provide atomic silicon to completely fill trenches of varying topography.

BRIEF DESCRIPTION OF THE DRAWINGS

These and other objectives are achieved in the present invention wherein a highly directional laser deposition system is utilized, at a precise angle and distance in relation to the feature to be filled, to ablate the material or materials to be deposited to achieve a complete fill. The invention is described in greater detail below and with reference to the attached drawings wherein.

DETAILED DESCRIPTION OF THE INVENTION

The present invention provides a method for utilizing laser ablation of target sources for the filling of vias and trenches in semiconductor fabrication. The invention solves the particular problem of filling features having high, i.e. greater than 1:1, aspect ratios. The method is useful for the deposition of pure metals and/or alloys, and for insulators, as may be needed for trench filling with silicon.

Figure 1:
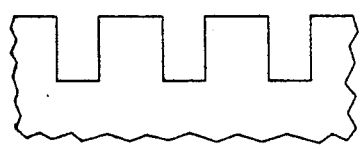
FIG. 1 illustrates a substrate having a patterned dielectric layer wherein said pattern is to be filled with a conductive material.

The laser deposition of materials is a technology which has been utilized for deposition of conformal films for quite some time. (See, for example, "Laser-induced plasmas for primary ion deposition of epitaxial Ge and Si films", by D. Lubben, S. A. Barnett, K. Suzili, S. Gorbatkin and J. L. Greene, J. Vac. Sci. Technol. B:3, pp 968–974, July/August 1985). The advantage of the technique has been recognized as one of superior thickness uniformity. We propose the use of beams of atoms and ions, which are generated by UV laser irradiation of various target surfaces, to fill trenches and vias in patterned insulator or semiconductor material, such as illustrated in FIG. 1. It should be understood that although UV lasers are used to illustrate this invention, the method is not limited to UV lasers and other beams with the necessary properties may be used as well. The hole-fill for the laser deposited films differs from that obtained from evaporation. In evaporated films, there is a directional component which allows films to be filled from the bottom up; however, the process results in voids along the edge of the trench or via. Hole filling by sputter deposition has also been attempted. However, the non-directional nature of sputtering becomes a problem for high aspect ratio holes. Material preferentially deposits at the top edge of the hole which results in shadowing, thereby preventing the material from reaching the bottom of the hole. Finally, the use of chemical vapor deposition had been proposed. However, the chemistry required for such deposition may be toxic and extensive tooling is required. As noted above, CVD has not been considered a viable alternative when relatively low temperature polymeric materials are to be used in the structures as either masks or as the patterned dielectric layer. In addition, CVD has the detriment of contamination due to the carbon precipitating from the organometallic.

The present solution provides a complete fill, of not only pure materials but compounds as well, in a single process flow. Complete fill of features with an aspect ratio of 2 have been achieved. The novel features of the UV laser-produced beams are their high degree of directionality (approximately ±20 from the surface normal) and the predominance in the beam of highly energetic species of neutrals and singly ionized atoms having large translational energy in comparison to atoms produced by evaporation. The inventors speculate that a plasma is formed in the first nanoseconds of the laser pulse; and, by subsequent irradiation, the plasma is further energized whereby ions are emitted perpendicular to said target and in the direction of the deposition surface. The highly directional nature of the laser method provides excellent concentration of particles, atoms and ions, in the fill area. Moreover, the fill appears to be enhanced by ion mobility. The laser ablation technique provides superior sidewall coverage which is speculated to be a function of the ion mobility of the energetic species generated by the beams. The imposition of a bias/voltage to the deposition surface can also enhance both the directionality and the energy of the target material ions. It is speculated that undercut regions may even be filled by this process. An additional asset of the process is that this method can operate well in a vacuum to eliminate contamination of the deposited material. Minimal heating of the substrate, limited to the total energy deposited by the beam, is advantageous not only from the perspective of minimal damage to the substrate surface and the structures therein, but also in that there will not be any charging of the substrate material which could otherwise cause contamination concerns, particularly from the carbon decomposition products of the preferred polymeric dielectrics. The low temperatures are not only advantageous for the integrity of the substrate; but also for the uniformity of the deposition. There is a high degree of uniformity of grain structure upon deposition of the material and grain growth is not promoted by surface heating of the deposition surface caused by the process itself.

Figure 2:
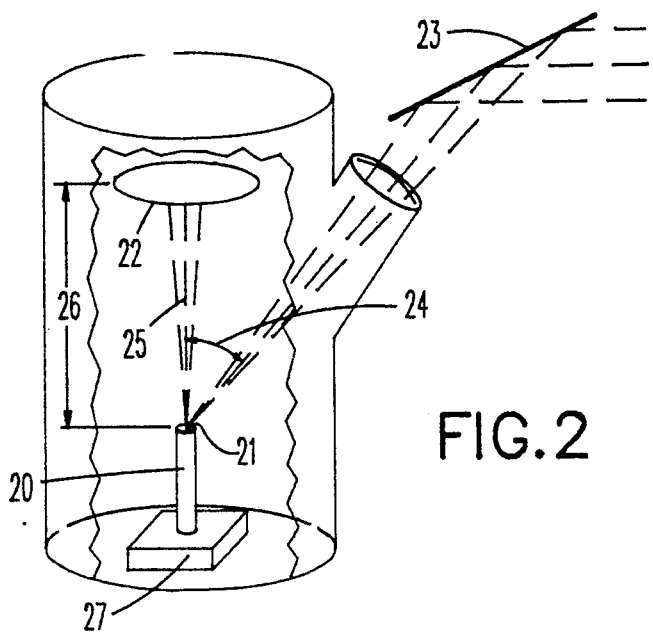
FIG. 2 illustrates a laser deposition system for use with the present inventive technique.

The inventive UV laser system, as illustrated in FIG. 2, was tested with both 248 nm or 308 nm excimer laser sources, having high absorption in the UV ranges. Other wavelength UV lasers can be utilized; and, as will be discussed further herein, may be preferable with defined material sets. In general, the system requires an oriented target of source material at an optimum distance from the deposition surface in a vacuum chamber. The target material may be in molten or solid form. The system illustrated in FIG. 2 shows the target material, 20, with its face or ablation surface, 21, parallel to the deposition surface, 22. An energy source, not shown but emanating from point 23, is directed onto the target surface, 21, at incident angle theta, 24, which will maximize the intensity of the beam 25, of material propelled toward the deposition surface. The incident angle theta may be any angle up to 90°, however, the inventors have found that the plasma may interfere with the laser beam at angles less than approximately 30°. Good results were found to be achieved when the angle of incidence of the beam was between 30° and 60°. The distance, 26, from the target surface, 21, to the deposition surface, 22 remains fixed but the target material, 20, may be either stationary or movably mounted on, for example, block 27, to rotate the target material to assure uniform irradiation and ablation of the target material, should a solid target be utilized. The rotation of the target has been found to be advantageous to prevent deterioration of the ablation efficiency when using a solid target. The deposition workpiece may also be movably mounted; however, the accuracy and uniformity of the proposed system would not necessitate such action. The vertical orientation of the target, 20, below the deposition surface, 22, as shown in FIG. 2, is not necessary, but is shown as one possible configuration. As will be discussed below, it may be advantageous to "invoke" gravitational forces with such a configuration.

Figure 5:
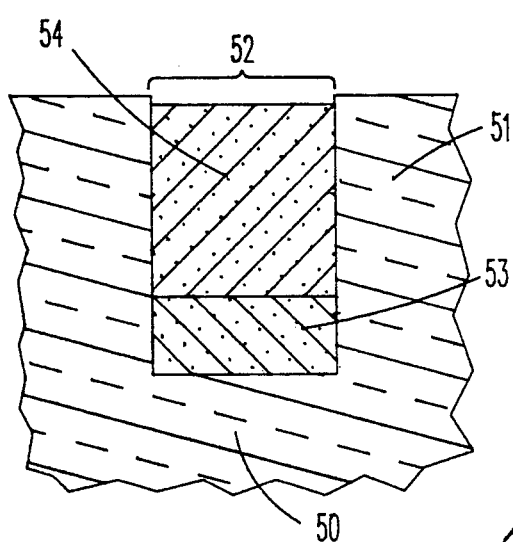
FIG. 5 is an illustration of a graded interface and layered filling for a stud hole.
Figure 4:
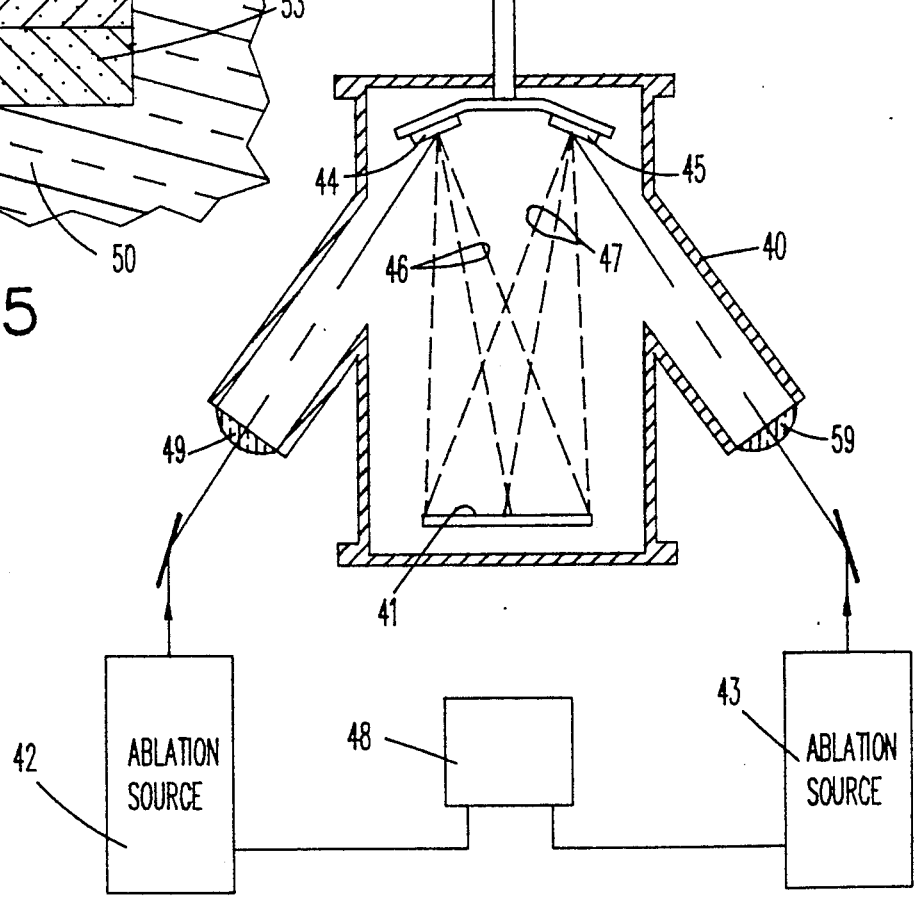
FIG. 4 is a schematic representation of a laser system for use in the deposition of two metals.

The system of FIG. 2 can be utilized for the deposition of any single material. It may be desired, however, to deposit more than one material, such as the two metals illustrated in FIG. 5. FIG. 5 shows a schematic rendering of a contact, such as a base contact for a transistor. The contact is formed, as is well-known in the art by etching the insulator material, 51, to form an opening or trench, 52. Conductive material is then deposited into the trench. In the instance of FIG. 5, it is desired to first deposit a semiconductor material, 53, to essentially bridge the gap between the underlying insulator material, 50, and the conductor, 54. (The motivations behind so configuring the contact, to address capacitance concerns, etc., are not relevant to the present invention.) Performing the depositions in a single process closed system eliminates contamination concerns. To obtain the desired configuration, multiple targets, such as are illustrated in FIG. 4 at 44 and 45, are required. The key element of this embodiment of the present invention is the presence of two ablation sources, 42 and 43, of target materials, 44 and 45, in one vacuum chamber, 40, so that beams, 46 and 47, of each material can be controlled independently to produce deposits on the deposition surface, 41. The ablation source for the two elements may be the same, in which case a mirror that is controlled by a computer can split the beam or alternately direct the beam towards targets 44 and 45 in any sequence in time or simultaneously. Alternately, there can be independent laser sources whose pulsing will be controlled by a single computer controlling the order in which the pulses will be generated. When a graded contact, such as is shown in FIG. 5, is desired, the lasers, 42 and 43, can be controlled by computer, 48 which is programmed to deliver a sequence of pulses wherein the initial deposition, 53 at the bottom of the feature, would consist of material ablated from a single source, for example 44 in FIG. 4, to a desired depth with an overlay of a compound, 54, comprising 44 and 45. A desirable contact composition, for example, would be tungsten silicide which has a stoichiometry of $W_1 Si_1$. To produce this compound, pulses, emanating from one or two sources, could be fired alternately in sequence or simultaneously at targets, 44 and 45, of tungsten and silicon. The fluence of the photons at each target would be adjusted either by focussing lenses, 49 and 59, or by neutral density filters (not shown) so that the same number of atoms of each element will be deposited on the deposition surface, 41, per unit time. The optimum laser fluence must be determined for each material which would be subjected to ablation, given not only the absorptivity of the material but also the desired deposition rate. Distance from the target to the deposition surface and incident angle must also be optimized. Elements 44 and 45 can be any materials which will absorb the energy from the source and, upon ablation, form the desired compounds. Several silicides and alloys which are known to be useful in the semiconductor art are included in Table 1. The list is not intended to be exhaustive; but, merely illustrative of the potential of the subject method. Metals which can be deposited include copper, tungsten, aluminum, gold, silver, molybdenum, iron, cobalt, tantalum, niobium, nickel, and alloys and mixtures thereof.

TABLE 1

| Element 1 | Element 2 | Deposit |
| --- | --- | --- |
| Tungsten | Silicon | Tungsten Silicide |
| Molybdenum | Silicon | Molybdenum silicide |
| Iron | Nickel | Fe-Ni |
| Tantalum | Silicon | Tantalum Silicide |

Other compounds which have successfully been deposited include Ni:Nb and Ni:Co compounds, which were deposited in an alternative embodiment of the invention discussed above. Whereas the first embodiment was described using multiple targets, in this alternative embodiment, a single source of the desired compound was utilized. The target was prepared by melting the desired nickel and niobium metals together. The authors wished to determine if the compound would be successfully ablated and re-deposited as a compound; or, whether the differing etch rates of the respective constituents would affect the ablation and deposition both as to rate and composition. The compound was subjected to a beam of 248 nm focussed to give a fluence setting of 3.6 joules/cm$^2$ per pulse, with a pulse rate of 70 Hz. The result was a uniform film of the desired compound with the desired stoichiometry.

The use of laser ablation for depositing silicon into high aspect ratio features for transistor isolation, is also highly effective. It has been found, though, that the procedure and the end result are maximized by use of a 193 nm laser source. Although the silicon target can be ablated readily by a 248 nm excimer laser, it has been found that silicon's low absorptivity (15%) of 248 nm radiation results in ejection of large particles of silicon due to the deep penetration of the laser photons. The Lubben, et al. article (ibid) used a shutter to filter out large particles to prevent them from being deposited on or in the blanket layers. When a 193 nm wavelength laser is used, the absorption of the laser energy can be improved by 50% with a consequent decrease in the percentage of material which is ejected in large particles. Ideally, a high density fill is achieved by deposition of silicon atoms or ions, without giving rise to the voids occasioned by the presence of large particles. Should a 248 nm excimer or other laser be utilized, deposition of large particles may be avoided by orienting the system as is illustrated in FIG. 2, with the ablation target, 21, below the deposition surface, 22. It may also be effective to orient the ablation target vertically in a horizontal deposition chamber. In each case, gravity will slow the heavier particles thereby preventing them from reaching the deposition surface or from having sufficient energy to adhere to the surface once the particles arrive at the deposition surface.

With respect to the energy of the deposition beam, it has been noted that a low temperature deposition technique is most advantageous for semiconductor processing. In applying any deposit over a doped region, it is difficult to avoid diffusion of the dopant into the deposited material using standard deposition techniques which are well known in the art and have been discussed above. An additional benefit of low temperature deposition is that lower temperature materials can be used on the deposition surface, either for pattern formation (i.e. lift-off), or insulation/dielectric layers, or both. The present method provides highly accurate deposition, which insures only localized heating of the deposition surface. The method is, additionally, highly efficient, with velocities corresponding to translational temperatures of 22000°–27000° C. in the case of Copper (which will be further detailed below) wherein heating of the deposition surface is for a negligible period. Finally, heating of the deposition surface is limited to the total energy deposited by the beam, which is minimal. This combination of benefits make the inventive method ideal for use with the forefront technology in semiconductor processing wherein the dielectric material of choice is a polymer. Ordinarily, it would be virtually impossible to deposit metal onto or into the polymeric layers. However, the present invention makes such technology workable.

EXAMPLE 1

Figure 6:
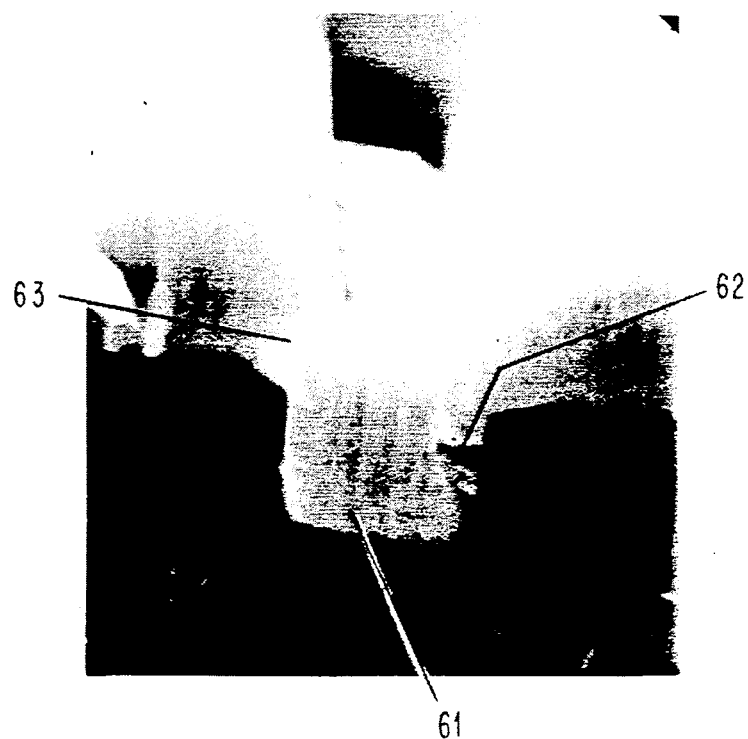
FIG. 6 illustrates the excellent fill achieved when depositing copper with the subject method.

FIG. 6 illustrates a via filled with copper in accordance with the subject method. A copper target was placed 8 cm from a silicon wafer. A beam of pulsed 248 nm radiation from a Lambda-Physik 203MSC laser was focussed on the Cu surface to give a fluence setting of 6.25 J/cm$^2$ per pulse at the working surface. The laser was pulsed at 60 Hz. The Cu target was rotated mechanically at 40 r.p.m. so that the laser did not etch a hole through the target material but ablated it nearly uniformly. On the silicon wafer, the deposition rate of copper was 3–6 microns/hour when the laser output was nominally 20 watts. FIG. 6 gives a cross-sectional view of a trench which was filled with copper. The directional nature of the process can clearly be seen in the photograph where a center pedestal, 62, is discernible. However, the edges, 63, of the pedestal are well-filled in with metal indicating that there is also metal deposition along the sides. As can be seen in the SEM, the upper edges 61 of the deposit are tapered. The tapering into the feature indicates that the highly energized ions/particles actually do sputter away some of the previously deposited material. Such a condition is ideal for providing a continuously open area for complete fill with the deposited material.

EXAMPLE 2

Figure 3:
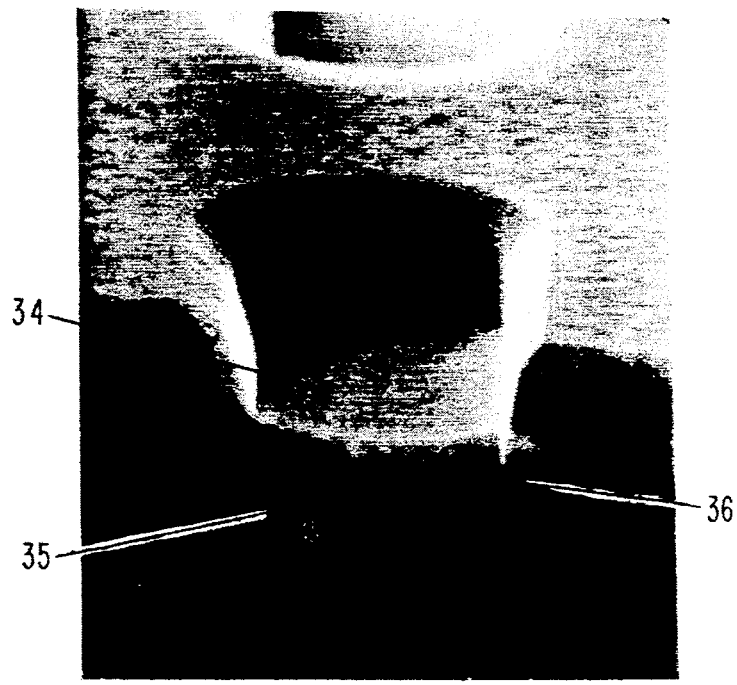
FIG. 3 illustrates the laser deposition technique as applied to the deposition of tungsten.

The profile is also recognized in FIG. 3 wherein tungsten was deposited into trenches. Tungsten was deposited by use of a 308 nm excimer laser with a fluence of 5.1 J/cm$^2$ per pulse. The laser was pulsed at 70 Hz. The distance to the wafer was 10 cm for this sample; and the vacuum was $9 \times 10^{-5}$ torr. In this sample, the deposition rate was approximately 1 micron per hour. As in example 1, the center pedestal 35 in the filled in edges 36 is easily discernible. The tapered upper edges 33, due to sputtering by the highly energized ions/particles, can also be seen.

The subject invention has been described with reference to several preferred embodiments. It is not intended that the invention be limited to the details as recited herein, which were provided as illustration. One skilled in the art will recognize the variations envisioned by the authors herein as falling within the spirit and scope of the present invention claimed herein.

What is claimed is:

1. A method for depositing a material into high aspect ratio features to a desired depth on a deposition surface comprising the steps of: positioning a target of more than one material to be deposited in a chamber, said target having a surface;

positioning a deposition surface facing the target surface;

directing at least one energy source at the target surface, said source having sufficient energy to ablate said more than one material to be deposited and wherein said directing of said energy source comprises orienting said energy source so that a beam from said energy source strikes said target surface at an included angle theta wherein theta is less than 90°;

ablating said material to create a plasma composed primarily of ions of said material, said plasma translating with high directionality toward said deposition surface; and depositing said ions of said material on said deposition surface to completely fill said high aspect ratio features.

2. The method of claim 1 wherein said energy source comprises a UV laser.

3. The method of claim 1 wherein said chamber is an evacuated chamber.

4. The method of claim 1 wherein said target positioning step comprises positioning the target below the deposition surface.

5. The method of claim 1 wherein said depositing step includes enhancing the directionality of said ions by applying a bias voltage to the deposition surface.

6. The method of claim 1 wherein said material comprises a metal.

7. The method of claim 1 wherein said material comprises silicon.

8. The method of claim 1 wherein theta is in the range from 30° to 60°.

9. A method for depositing a material into high aspect ratio features to a desired depth on a deposition surface comprising the steps of:

positioning a target of at least one material to be deposited in a chamber, said target having a surface, wherein said material to be deposited comprises a compound and wherein said target surface comprises said compound;

positioning a deposition surface facing the target surface;

directing at least one energy source at the target surface, said source having sufficient energy to ablate said at least one material to be deposited and wherein said directing of said energy source comprises orienting said energy source so that a beam from said energy source strikes said target surface at an included angle theta wherein theta is less than 90°;

ablating said material to create a plasma composed primarily of ions of said material, said plasma translating with high directionality toward said deposition surface; and depositing said ions of said material on said deposition surface to completely fill said high aspect ratio features.

10. The method of claim 1 wherein said target positioning comprises movably mounting said target.

11. The method of claim 1 wherein said deposition surface positioning comprises movably mounting said surface.

12. The method of claim 1 wherein said ablating step comprises irradiating said more than one material to be deposited simultaneously.

13. The method of claim 1 wherein said ablating step source to each of said more than one materials to be deposited in sequence.

14. The method of claim 13 wherein said energy source is a pulsed UV laser and said ablating step comprises delivering at least one pulse to each of said more than one materials to be deposited in sequence.

15. The method of claim 1 wherein said directing step comprises orienting more than one energy source and wherein said ablating step comprises irradiating each of said more than one materials to be deposited with one of said more than one energy sources.

16. The method of claim 15 wherein said more than one energy sources are operated simultaneously.

17. The method of claim 15 wherein said more than one energy sources are operated in a sequence.

18. The method of claim 12 wherein said directing step comprises mounting a single energy source in said system and further comprising providing at least one lens to split a beam from said single source into more than one beam and wherein said ablating comprises irradiating said materials to be deposited by more than one beam from said single source.

19. The method of claim 18 wherein said irradiating comprises providing said more than one beams to said more than one materials to be deposited simultaneously.

20. The method of claim 19 wherein said irradiating and ablating comprise:

providing said more than one beam to said more than one materials to be deposited in a sequence;

monitoring the depth of deposition at said feature; and discontinuing said ablation when a predetermined depth is attained.

21. A method for providing complete fill of high aspect ratio vias and trenches in semiconductor structure comprising:

providing a target of metals to be deposited, said target having a surface;

positioning a deposition surface facing said target surface;

irradiating said target surface with an energy source sufficient to ionize said metal and propel said ions to said deposition surface, wherein an included angle between a direction perpendicular to said target surface and a beam from said energy source irradiating said target surface in between 30° and 60°;

ablating said material to create a plasma composed primarily of ions of said metal, said plasma translating with high directionality toward said deposition surface; and depositing said ions of said metal on said deposition surface to completely fill said high aspect ratio vias and trenches.

22. The method of claim 21 wherein said metal is selected from the group consisting of copper, tungsten, aluminum, gold, silver, molybdenum, iron, tantalum, cobolt, niobium, nickel, and alloys and mixtures thereof.

23. The method of claim 21 wherein said metal comprises copper.

24. The method of claim 22 wherein said metal comprises tungsten.

25. The method of claim 21 wherein said metal comprises a compound.

26. The method of claim 21 wherein said metal comprises more than one metal material to be deposited.

27. The method of claim 21 wherein said target is molten.

28. The method of claim 21 wherein said energy source is an UV laser.

* * * * *